United States Patent
Styles

(10) Patent No.: US 12,270,855 B2
(45) Date of Patent: Apr. 8, 2025

(54) DEBUG PROBE FOR MEASURING AT LEAST ONE PROPERTY OF A TARGET SYSTEM

(71) Applicant: Arm Limited, Cambridge (GB)

(72) Inventor: Christopher James Styles, Cambridge (GB)

(73) Assignee: Arm Limited, Cambridge (GB)

( * ) Notice: Subject to any disclaimer, the term of this patent is extended or adjusted under 35 U.S.C. 154(b) by 266 days.

(21) Appl. No.: 17/305,910

(22) Filed: Jul. 16, 2021

(65) Prior Publication Data
US 2022/0026490 A1 Jan. 27, 2022

(30) Foreign Application Priority Data

Jul. 22, 2020 (GB) .................................... 2011363

(51) Int. Cl.
| | | |
|---|---|---|
| *G01R 31/317* | (2006.01) | |
| *G01R 19/10* | (2006.01) | |
| *G06F 11/36* | (2006.01) | |
| *G06F 11/362* | (2025.01) | |

(52) U.S. Cl.
CPC ....... *G01R 31/31705* (2013.01); *G01R 19/10* (2013.01); *G06F 11/3636* (2013.01)

(58) Field of Classification Search
CPC ................ G01R 19/10; G01R 31/3167; G01R 31/31705; G06F 11/3636; G06F 11/3656
See application file for complete search history.

(56) References Cited

U.S. PATENT DOCUMENTS

| | | | |
|---|---|---|---|
| 7,028,240 B1* | 4/2006 | Bautista, Jr. ........... | G11C 29/16 714/733 |
| 2003/0154452 A1* | 8/2003 | Kirkpatrick ........ | G01R 1/06788 324/755.01 |
| 2007/0168749 A1* | 7/2007 | Stewart, III ............ | G06F 11/25 714/39 |
| 2012/0197570 A1 | 8/2012 | Ramezani | |
| 2015/0082017 A1* | 3/2015 | Bernon-Enjalbert ....................... | G06F 11/3656 713/100 |
| 2015/0082092 A1* | 3/2015 | Sarangi ............ | G01R 31/31721 714/30 |
| 2016/0217059 A1 | 7/2016 | Ota et al. | |
| 2021/0313921 A1* | 10/2021 | Bode ...................... | G01R 19/10 |
| 2022/0291257 A1* | 9/2022 | Laldin ................ | G01R 13/0227 |
| 2022/0334156 A1* | 10/2022 | Balboni ................. | G01R 19/10 |

* cited by examiner

*Primary Examiner* — Neel D Shah
*Assistant Examiner* — Adam S Clarke
(74) *Attorney, Agent, or Firm* — NIXON & VANDERHYE P.C.

(57) ABSTRACT

A debug probe (102) for controlling debugging of a target system (104) is described, the debug probe comprising an interface (128) comprising a plurality of pins (202), debug control circuitry (130) to control debugging of the target system based on a digitally sampled level of at least one signal communicated through at least one of the plurality of pins, and measurement circuitry (204) to make a measurement of a property of the target system based on an analogue level of a signal received through said at least one of the plurality of pins.

20 Claims, 8 Drawing Sheets

DEBUG PROBE FOR MEASURING AT LEAST ONE PROPERTY OF A TARGET SYSTEM

CROSS-REFERENCE TO RELATED APPLICATIONS

This application claims priority pursuant to 35 U.S.C. 119(a) to United Kingdom Patent Application No. 2011363.5, filed Jul. 22, 2020, which application is incorporated herein by reference in its entirety.

BACKGROUND

The present technique relates to the field of debug probes for controlling debugging of a data processing system.

During development of software to execute on a target data processing system, it can be useful to monitor the execution of code by the target data processing system, to identify any potential issues that may be causing loss of performance for example. For this purpose, a debug probe may be used, which controls debugging of a target system based on signals communicated through a digital interface between the debug probe and the target data processing system.

Viewed from an example of the present technique, there is provided a debug probe for controlling debugging of a target system, the debug probe comprising:
an interface comprising a plurality of pins;
debug control circuitry to control debugging of the target system based on a digitally sampled level of at least one signal communicated through at least one of the plurality of pins; and
measurement circuitry to make a measurement of a property of the target system based on an analogue level of a signal received through said at least one of the plurality of pins.

Viewed from another example of the present technique, there is provided a system comprising:
the debug probe described above; and
the target system.

Viewed from another example of the present technique, there is provided a method of measuring at least one property of a target system using a debug probe comprising an interface comprising a plurality of pins, the method comprising:
controlling debugging of the target system based on a digitally sampled level of at least one signal communicated through at least one of the plurality of pins; and
making a measurement of a property of the target system based on an analogue level of a signal received through said at least one of the plurality of pins.

BRIEF DESCRIPTION OF THE DRAWINGS

Further aspects, features and advantages of the present technique will be apparent from the following description of examples, which is to be read in conjunction with the accompanying drawings, in which.

DETAILED DESCRIPTION

Figure 1:
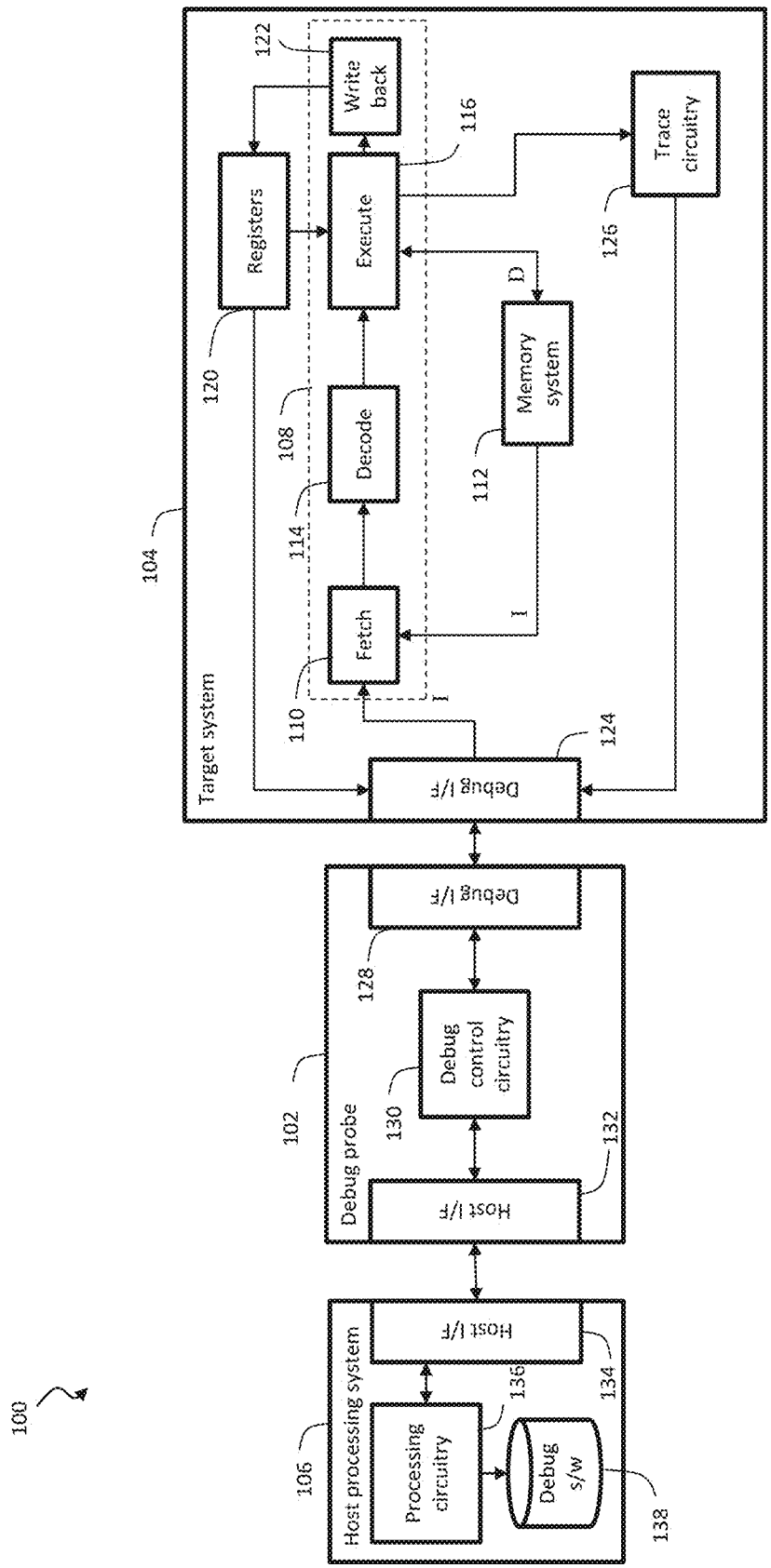
FIG. 1 schematically illustrates a debug probe in communication with a target system and a host processing system.

Before discussing the embodiments with reference to the accompanying figures, the following description of example embodiments and associated advantages is provided.

As discussed above, a debug probe may be provided to control debugging of a target system (e.g. a target data processing system). However, the inventor realised that it can also be useful to be able to measure other properties associated with a target system, such as the power consumption of the target system, current flow in the target system, a voltage difference associated with the target system, or any other property associated with the system. Normally the aim of debugging is to check whether code will function correctly and to check for performance issues. However, with the recent increase in prevalence of devices where battery life is one of the most important criteria—such as Internet of Things (IoT) devices—software developers are increasingly interested in optimising their code for improved power efficiency, even at the expense of performance. Therefore, recently, the ability to measure analogue quantities such as power during debugging is becoming of interest.

Debug probes are not typically used for measuring analogue quantities such as current, power or voltage, since the digital interface of a debug probe is normally used only for the exchange of digitally sampled signals for reading out diagnostic information from the target or providing debug control signals to the target, rather than for communicating analogue signals. Moreover, the digital interface between a debug probe and target system is typically standardised to allow the same debug probe to work with a wide variety of different target systems, meaning that it is difficult to add extra pins onto the interface for extra purposes beyond the standard signals supported on the interface.

The current consumption of a target system during execution of code can be measured by a dedicated current probe; however, this requires a second probe device to be provided in addition to the debug probe. Moreover, dedicated current probes are typically expensive, and often require structural changes to be made to the hardware of the target system or additional hardware to be provided. For example, there is typically no standardised interface or connection on the target system for connecting to a current probe.

While these costs may be justified in some situations—for example, where detailed information about particular properties of the target system is required, such as measuring the relationship between the instantaneous current consumption of the target system and processes carried out by the target system—the inventor of the present technique realised that it would be advantageous to be able to measure properties of a target system without incurring these costs.

The present technique, therefore, provides a debug probe which is adapted to make a measurement of a property of a target system. In particular, the present technique provides a debug probe for controlling debugging of a target system, the debug probe comprising an interface comprising a plurality of pins and debug control circuitry to control debugging of the target system based on a digitally sampled level of at least one signal communicated through at least one of the plurality of pins (e.g. for a single-bit signal, the digitally sampled level may be interpreted as either logic "1" or logic "0", or for an N-bit signal the digitally sampled level may be interpreted as one of $2^N$ discrete logic levels). The digital sampling of the signal could take place either at the debug probe or at the target system (e.g. the signal could either be a signal transmitted from the debug probe to the target system, in which case the target system may digitally sample the signal, or a signal received by the debug probe from the target system, in which case it is the debug probe which digitally samples the signal during control of debugging). The debug probe of the present technique also includes measurement circuitry to make a measurement of the property of the target system based on an analogue level of a signal received through said at least one of the plurality of pins.

In this way, the debug probe of the present technique is able to measure a property of a target system based on an analogue signal detected over a digital interface, without needing a separate current probe and while still using a standard debug interface designed for use with digital signals. In particular, the layout and functionality of the interface of the debug probe—and the corresponding interface of the target system—does not need to be altered, since the measurement is made using an analogue level of a signal received through the same pins used to communicate signals for controlling debugging of the target system. As a result, the costs associated with making a measurement of a property of the target system can be significantly reduced. Moreover, because the interface of the debug probe does not need to be altered, backwards compatibility with target systems which do not support the ability to make measurements in this way is maintained.

The debug probe according to the present technique may be adapted to measure any of a number of properties of the target system based on the analogue level of the signal received through the pins of the interface normally used for digitally sampled signals. However, in some examples, the property of the target system measured using the debug probe comprises at least one of an electrical current in the target system, instantaneous power consumption in the target system, and a voltage difference across the target system. The inventors realised that, while detailed measurements of the relationship between the current consumption of the target system and processes performed by the target system can be useful, a measurement of the instantaneous current consumption of the target system in the steady state (and associated measurements such as the instantaneous power consumption, or a voltage difference) can also be useful during debugging, and can be made in a more cost effective manner using the debug probe of the present technique.

The inventors of the present technique also realised that at least some signals communicated via the plurality of pins in the debug interface are expected to remain at a constant digital level (e.g. a constant level corresponding to logic "1" or logic "0") during functional operation of the target system, and that it would thus be possible to use the one or more pins over which those signals are communicated for an alternative purpose during operation of the target system (in some cases, even while the same physical signal on those pins is also being used for the normal purpose for which it is sampled as a digital signal). Therefore, in some examples of the present technique, the at least one signal communicated through the at least one of the plurality of pins comprises at least one signal expected to be at a constant digital level during functional operation of the target system.

The measurement circuitry in the debug probe may be configured to make the measurement of the property of the target system in any of a number of different ways. In some examples, the at least one of the plurality of pins comprises at least a first pin and a second pin, wherein the measurement circuitry is configured to receive a first signal through the first pin and a second signal through the second pin. The measurement circuitry can then be configured to detect a voltage difference between the first pin and the second pin.

The voltage difference detected by the measurement circuitry in these examples may then, either directly (e.g. where the property to be measured is the voltage difference itself) or indirectly indicate the property of the target system. The hardware required to measure a voltage difference between the first and second pins can be fairly cheap and simple to implement in the debug probe. This means that the present technique can be implemented with only minimal changes to the structure of the debug probe, thus lowering the costs associated with measuring a property of the target system.

In some examples, the measurement circuitry comprises a differential amplifier to receive the first signal and the second signal and to generate an amplified analogue signal indicative of the voltage difference between the first pin and the second pin. In this way, a minor structural adaptation to the debug probe (the inclusion of a differential amplifier) enables the debug probe to also measure a voltage difference associated with the target system. The differential amplifier can generate an amplified signal with a dynamic range compatible with other components in the debug circuitry can be generated, allowing the existing components to handle the signal.

Any number of the pins in the interface of the debug probe may be used to measure the property of the target system, but in some examples the measurement may be based (at least) on a signal received over a reset pin. In these examples, the debug control circuitry is configured to assert a reset signal via the reset pin, which is one of the at least one of the plurality of pins, to trigger a reset of the target system, and the measurement circuitry is configured to make the measurement of the property of the target system based on the analogue level of the signal received on the reset pin in absence of the reset signal being asserted by the debug control circuitry. The signal received on the reset pin may be the only signal used to measure the property of the target system, or it may be one of a number of signals communicated over a number of different pins that are used in combination to make the measurement. Since the signal communicated via the reset pin is expected to remain at a constant digital level during normal debugging (as the reset signal would be expected to remain not-asserted during the main debugging processing), the measurement of the target system may be made using this pin without affecting the normal functioning of the target system or the debug probe.

In some examples, the reset pin is coupled to an open drain output of the debug control circuitry, such that an output of the target system through the reset pin can either be pulled to zero (e.g. ground—a digitally sampled level of logic "0") or allowed to float (e.g. the output is not pulled to any specific voltage—it is neither pulled up to a digitally sampled level of logic "1" nor pulled down to ground). In such examples, the reset signal is asserted by the debug control circuitry connecting the reset pin to ground, allowing the signal communicated through the reset pin to be pulled to the ground level (e.g. a digitally sampled level of logic "0"). This arrangement provides freedom to use the same physical line to measure the analogue property of the system and to assert the reset signal, since when the reset signal is not being asserted, there is no constraint on the voltage on the line, and it can thus be varied to indicate the property of the target system to be measured.

In some examples, the measurement circuitry is configured to detect the analogue level of the signal based on a modulation of the at least one signal communicated through the at least one of the plurality of pins. The modulation may be a variation in a property detected by the debug control circuitry, such as a modulation of the voltage or current detected through the at least one of the plurality of pins.

In some examples, the debug control circuitry is configured to detect whether the at least one signal is asserted based on a comparison between a voltage detected through the at least one of the plurality of pins and a threshold voltage. In such examples, the measurement circuitry may be configured to detect the analogue level of the signal based on a modulation of the voltage detected through the at least one of the plurality of pins in a range of voltages entirely below the threshold voltage or a range of voltages entirely above the threshold voltage.

In this way, the debug control circuitry can take advantage of the way in which digital signals are sampled. By detecting a modulation either wholly above or wholly below the threshold voltage, this allows the digital level indicated by the voltage to remain constant (e.g. at a constant level of logic "1" or logic "0"), while still providing information allowing the property of the target system to be measured based on the analogue level of the same physical signal. This allows the same pin of a standardised debug interface on the debug probe to be used for its standard purpose (when sampled digitally) while simultaneously also using the pin for a new purpose of making a measurement of an analogue property. It should be noted that the digitally sampled level of a signal may be indicated based on only a single threshold (e.g. the digitally sampled level is interpreted as logic "1" above the threshold and as logic "0" below the threshold), or it may be indicated based on multiple thresholds. In the case of multiple thresholds, the signal may be raised to a digitally sampled level of logic "1" by raising the voltage to above a first threshold, and may be lowered to a digitally sampled level of logic "0" by bringing the voltage to below a second threshold, lower than the first threshold. In this case, the debug control circuitry may still detect whether the signal is asserted based on a single threshold level between the first and second thresholds, but the error in this determination can be reduced. The modulation of the signal in this case may therefore be kept entirely above the first threshold or entirely below the second threshold, to minimise the error in the determination of whether the signal is asserted.

In some examples, the measurement circuitry comprises an analogue-to-digital converter to convert an analogue measurement dependent on the analogue level of the signal received through said at least one of the plurality of pins into a digital measurement of the property of the target system.

In some examples, the debug control circuitry is configured to detect the presence of the target system based on the digitally sampled level of the at least one signal communicated through the at least one of the plurality of pins. In his case, the digitally sampled level of the at least one signal would be expected to remain constant while the debug probe is connected to the target system, allowing the same signal to be used for an additional purpose (e.g. making a measurement of the target system). The at least one signal could therefore be used as a reference voltage for comparing against another analogue measured signal obtained from the target system when making the measurement of the property of the target system. The at least one signal could also be used to make the measurement by modulating the signal within the bounds of the constant digitally sampled level. The at least one signal may be a signal constantly asserted by the target system, which is thus detected by the debug control circuitry whenever the target system is present. In one particular example, the at least one signal may be the supply voltage, from which the target system is supplied.

In some examples, a host interface is provided, wherein the debug control circuitry is configured to communicate with a host processing system through the host interface. The host processing system may be any processing system capable of receiving data from the debug probe. For example, the host processing system could be a general purpose computer capable of running a program for analysing information received from the debug probe, or it could be dedicated hardware for controlling operations of the debug probe to debug the target system.

In some examples, the measurement circuitry is configured to provide the measurement of the property of the target system to the host processing system via the host interface.

The debug probe may be arranged to control debugging of the target system in any of a number of ways. For example: the debug control circuitry may request information from the target system indicative of the state of one or more registers in the target system; the debug control circuitry may inject one or more instructions into processing circuitry of the target system and observe an effect of at least one process performed by the processing circuitry following the injection of the one or more instructions; and/or the debug control circuitry may collect trace data output by trace generation circuitry in the target system, wherein the trace data comprises data indicative of processing activities of the processing circuitry. These processes allow the debug probe to gather information indicative of the state if the target system and the processes being performed by the target system, which can be useful for diagnostic purposes when performing debugging of software executing on the target system. The debug control circuitry may be arranged to perform any one of the above processes, or may perform a plurality of the above processes in any combination. Moreover, the debug control circuitry may perform other processes related to debugging that are not mentioned above.

Some examples of the present technique describe a system comprising the debug probe described above and the target system itself.

In some examples, the system of the present technique comprises a shunt resistor coupled between a supply voltage source and the target system, wherein the target system is configured to draw current through the shunt resistor. In this way, the shunt resistor may reduce the voltage supplied to the target system by an amount proportional to the resistance of the shunt resistor and the current drawn by the target system.

In some examples, the at least one of the plurality of pins comprises at least a first pin and a second pin, and the measurement circuitry is configured to receive a first signal through the first pin and a second signal through the second pin. In such examples, the measurement circuitry is configured to detect a voltage difference between the first pin and the second pin, and the first pin and the second pin are connected either side of the shunt resistor.

In this way, because the shunt resistor reduces the voltage supplied to the target system by an amount proportional to the current consumption of the target system (as noted above), the voltage across the shunt resistor (detected by the measurement circuitry) is proportional to the current consumption of the target system. This allows a property such as the current of the target system (or associated properties such as the voltage supplied to the current system, or the power consumption of the target system) to be measured based on the voltage difference across the shunt resistor. In this way, only a minimal alteration to the structure of the target system is required, which reduces the costs associated with making a measurement of a property of the target system.

In some examples, the debug control circuitry is configured to assert a reset signal via the second pin to trigger a reset of the target system. The measurement circuitry may then be configured to detect the voltage difference between the first pin and the second pin in the absence of the reset signal being asserted by the debug control circuitry, and the system may comprise a reset resistor connected between the shunt resistor and the second pin, in parallel with the target system, where the reset resistor has a higher resistance than the shunt resistor.

The reset resistor in this example thus allows signals communicated through the second pin to both trigger a reset of the target system when the reset signal is being asserted (where the resistance of the reset resistor prevents the reset signal and the voltage supply to the target signal from interfering with each other), and to be used to measure the property of the target system when it is not being asserted. For example, the signal communicated through the first pin may be a signal used to detect the presence of the target system, and the signal communicated through the second pin may be the reset signal. In this example, the first pin may be coupled to the voltage supply side of the shunt resistor and the second pin may be coupled to the target system side of the shunt resistor. It will be appreciated that this arrangement using a shunt resistor is just one example of how the target system could be connected to the debug probe—other implementations of the present technique may use different techniques to connect the debug probe to the target system.

Particular embodiments will now be described with reference to the figures.

FIG. 1 schematically illustrates a system 100 comprising a debug probe 102 in communication with a target system 104 and a host system 106. The target system 104 may be any type of data processing system, but in some examples the target data processing system 104 may be a system-on-chip (SoC) or an integrated circuit, where the SoC or integrated circuit comprises at least one microprocessor or central processing unit (CPU).

The target system 104 comprises a processing pipeline 108, which has a number of stages. In particular, the processing pipeline 108 of the target system 104 shown in FIG. 1 includes a fetch stage 110, configured to fetch instructions from the memory system 112. The fetch stage 110 then passes these instructions to a decode stage 114, which decodes the instructions to generate control signals for controlling an execute stage 116 to perform processing operations in response to the decoded instructions.

The execute stage 116 has access to a register file 120, and the memory system 112. The execute stage may be arranged to execute the decoded instructions either by accessing the registers 120, or by accessing the memory system 112. For example, the execute stage 116 may execute load or store instructions by accessing the relevant location in the memory system 112, and may execute other instructions using input values read from the registers 120.

The processing pipeline 108 also includes a writeback stage 122, which writes the results of instructions executed by the execute stage 116 to the registers 120.

It should be appreciated that the stages shown in the processing pipeline 108 of FIG. 1 are just one example of how the target system 104 may be arranged. The processing pipeline 108 may be configured differently—for example, if the target system 104 is arranged to execute instructions out-of-order with respect to a program order, the processing pipeline 108 may also include a register rename stage which remaps register references in instructions to microarchitectural registers in hardware (e.g. to eliminate false data dependencies between independent instructions writing to the same architectural register due to having to reuse that architectural register due to register pressure) and an issue stage which issues the decoded instructions to the execute stage 116.

It should also be noted that the memory system 112 may be organised as a memory hierarchy, comprising several levels. For example, the memory system 112 may include a memory and one or more levels of cache. Each cache may be shared between instructions and data, or separate caches may be provided for instructions and data. The precise arrangement of the memory system is merely an implementation detail, however, and may be tailored to the requirements of the system.

The target system 104 also includes trace generation circuitry 126. The trace generation circuitry 126 generates trace data indicative of processing activities of the processing circuitry 126.

A debug interface 124 is also provided in the target system, via which the target system 104 communicates with the debug probe 102. In particular, signals are communicated between the debug interface 124 of the target system and a corresponding debug interface 128 of the debug probe 102.

The debug probe 102 includes debug control circuitry 130, which controls debugging of the target system 104 based on signals communicated through the debug interface 124, 128.

For example, the debug control circuitry 130 may send a request to the target system 104 via the debug interface 124, 128 requesting information indicative of the state of one or more of the registers 120 of the target system. The target system 104 may then, in response, transmit this information to the debug probe 102. The debug control circuitry 130 may also (or alternatively) control the injection of one or more instructions into the processing pipeline 108 of the target system 104, allowing the debug control circuitry 130 to observe an effect of at least one process performed by the execution circuitry 116 following the injection of the one or more instructions. For example, the instructions may be injected into the fetch circuitry 110. Another way in which the debug control circuitry 130 may control debugging of the target system 104 is by collecting the trace data output by the trace generation circuitry 126. The debug control circuitry 130 may also (or alternatively) set control registers in the target system 103 to define addresses at which program execution in the processing pipeline 108 should be halted to allow the debugger to step in and take action—for example, by inspecting the register contents at that point, or injecting an extra sequence of instructions into the processing pipeline 108 to be executed. For example, these addresses could be breakpoint addresses, which are program instruction addresses for which the action of the debugger is invoked when program execution reaches that program instruction address, and/or watchpoint addresses, which are data addresses for which the action of the debugger is invoked when there is a memory access to that data address. It should be appreciated that the debug control circuitry 130 may perform any one of the processes described above, or any combination of these processes. Moreover, other processes involved in debugging the target system 104 may also be controlled by the debug control circuitry 130.

The debug probe 102 also includes a host interface 132, via which the debug probe 102 communicates with the host processing system 106. In particular, signals are communicated between the host interface 132 of the debug probe 102 and a corresponding host interface 134 of the host processing system 106.

The host processing system 106 includes processing circuitry 136, which is arranged to execute debug software 138. The processing circuitry 136 may execute the debug software 138 to control the debug probe 102 to debug the target system 104. For example, the processing circuitry 136 may request information from the debug probe 102, such as information indicative of the state of the registers 120 of the target system. The processing circuitry 136 may also indicate instructions to be injected into the processing pipeline 108 of the target system 104 by the debug probe 102. In addition (or alternatively), the processing circuitry 136 may execute the debug software 138 to analyse debug data received from the debug probe 102 (e.g. information about the state of the registers 120, trace data, or information about an effect of at least one process performed by the execution circuitry 116 of the target system 104 following the injection of the one or more instructions into the pipeline 108 by the debug control circuitry 130).

During development of a target system, in addition to debugging the system, a developer may wish to measure properties of the target system. For example, it may be useful to measure an electrical current in the target system, a voltage difference associated with the target system, or power consumption of the target system. Current probes are available which can make a measurement of the current consumption of the target system; however, existing current probes can be expensive, and may require substantial structural alterations to be made to the target system. Therefore, the present technique aims to provide a more cost effective approach to measuring properties of the target system.

Figure 2:
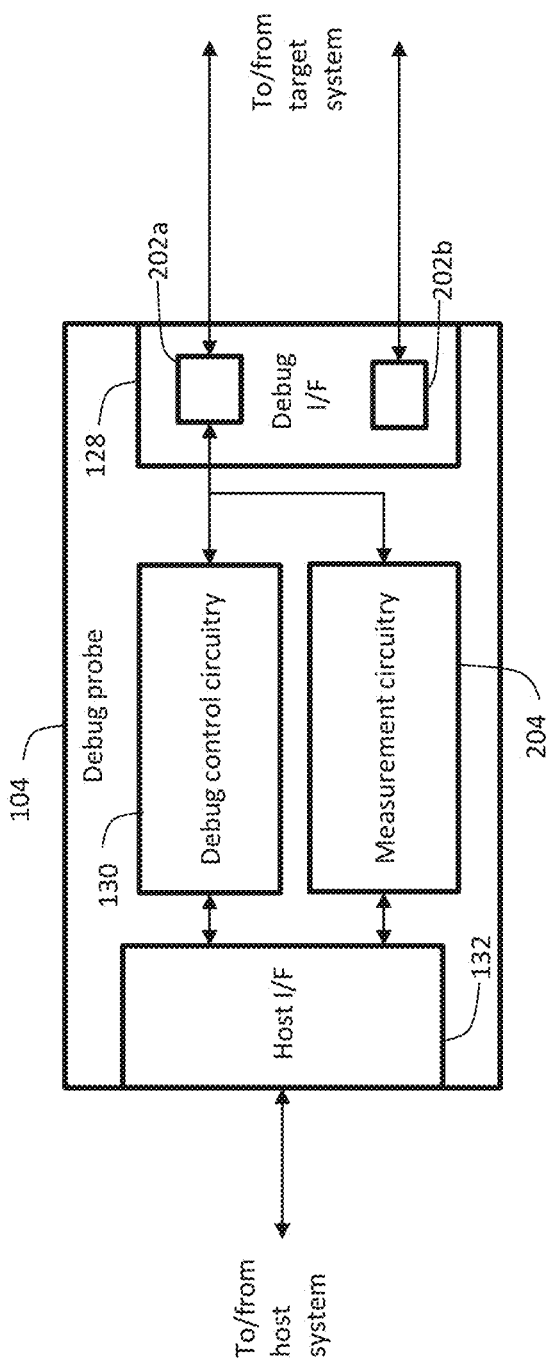
FIG. 2 schematically illustrates a debug probe.

FIG. 2 schematically illustrates an example of the configuration of a debug probe 104 in accordance with the present technique. As shown in FIG. 2, the debug interface 128 may be made up of a plurality of pins 202a, 202b. In FIG. 2, only two pins 202 are shown, but it will be appreciated that the debug interface 128 may include more than two pins. The debug control circuitry 130 controls debugging of the target system (not shown) based on a digitally sampled level of signals communicated through the pins 202.

The debug probe 104 also includes measurement circuitry 204, which makes a measurement of a property of the target system based on an analogue level of a signal received through the same pins 202 through which debugging is controlled by the debug control circuitry. In this way, the measurement circuitry 204 makes an analogue measurement through a digital interface.

Target systems are typically already set up to communicate with a debug probe 104 (for example, through a debug interface as shown in FIG. 1), so adapting a debug probe 104 to also make a measurement of a property of the target system provides a more cost effective alternative to a conventional current probe, for which a standard interface is not typically provided. In particular, since the measurement circuitry 204 makes the measurement of the at least one property of the target system based on an analogue level of signals communicated through the same pins 202 used to control debugging of the target system, the structure of the debug interface 128 does not need to be altered. This, therefore, provides a particularly cost-effective approach to measuring properties of the target system.

It may seem counter-intuitive to adapt the debug probe 104 in this way, since the property of the target system to be measured (such as a current, a voltage drop or the power consumption) will typically be measured as an analogue signal, whereas the debug probe 104 is typically arranged to communicate with the target system via digital signals. However, as will be seen from the discussion below, the inventor realised that it is possible to obtain an analogue measurement of a property of the target system from digital signals communicated between the target system and the debug probe 104.

As noted above, target systems are typically already set up to communicate with a debug probe. More particularly, since the debug probe may be provided separately from the target system, the arrangement of the pins in the debug interface 128 of the debug probe (and the corresponding arrangement of pins in the debug interface of the target system) may be standardised. One particular example of a debug interface 128 is the 10-pin Cortex (®) Debug Connector developed by Arm (®) Limited, the layout of which is schematically illustrated in FIG. 3.

Figure 3:
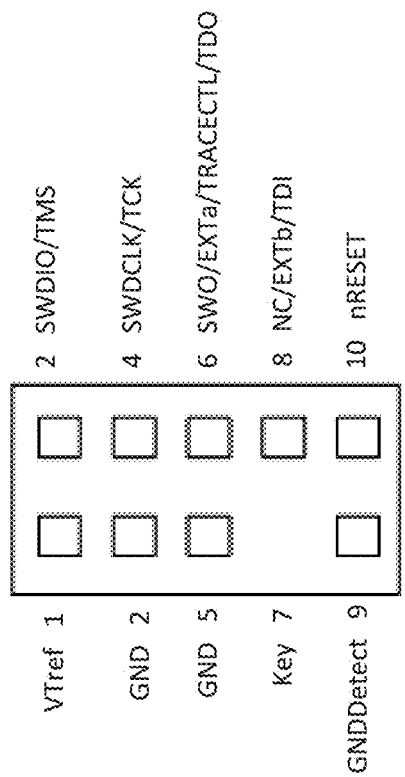
FIG. 3 schematically illustrates the layout and functions of the pins in one example of a debug interface.

In the connector 128 shown in FIG. 3, the pins are numbered 1 to 10. Pin 1 is the VTref or VDetect pin. The signal received by the debug control circuitry through the VDetect pin, in combination with the signal received through the GNDDetect pin (pin 9) enables the debug control circuitry to determine whether the debug probe is currently connected to a target system—for example, the VDetect pin may be arranged (when the probe is in use) to connect to the supply voltage of the target system, so that a voltage difference across pins 1 and 9 indicates the presence of the target system.

Pin 2 is the SWDIO/TMS pin, which in one arrangement may communicate a signal used to select a particular test mode.

Pins 3 and 5 are labelled GND, and each connects to ground.

Pin 4 is labelled SWDCLK/TCK, and a clock signal is typically communicated through this pin.

Pin 6 is labelled SWO/EXTa/TRACECTL/TDO, and the signal communicated through this pin indicates test data output by the target system.

Position number 7 on the connector 128 is the key, and is used to properly orient the connector. In this particular example, no pin is present in this position on the connector 128, allowing a user to easily determine the correct orientation of the connector 128 by looking for the missing pin.

Pin 8 is labelled NC/EXTb/TDI, and the signal communicated through this pin indicates test data to be input into the target system.

Finally, pin 10 is the nRESET pin, through which a reset signal may be asserted to trigger a reset of the target system.

It should be appreciated, however, that this is just one example of the layout of pins in a debug interface 128. Other layouts are also possible, e.g. for interfaces conforming to other debug interface standards.

Figure 4:
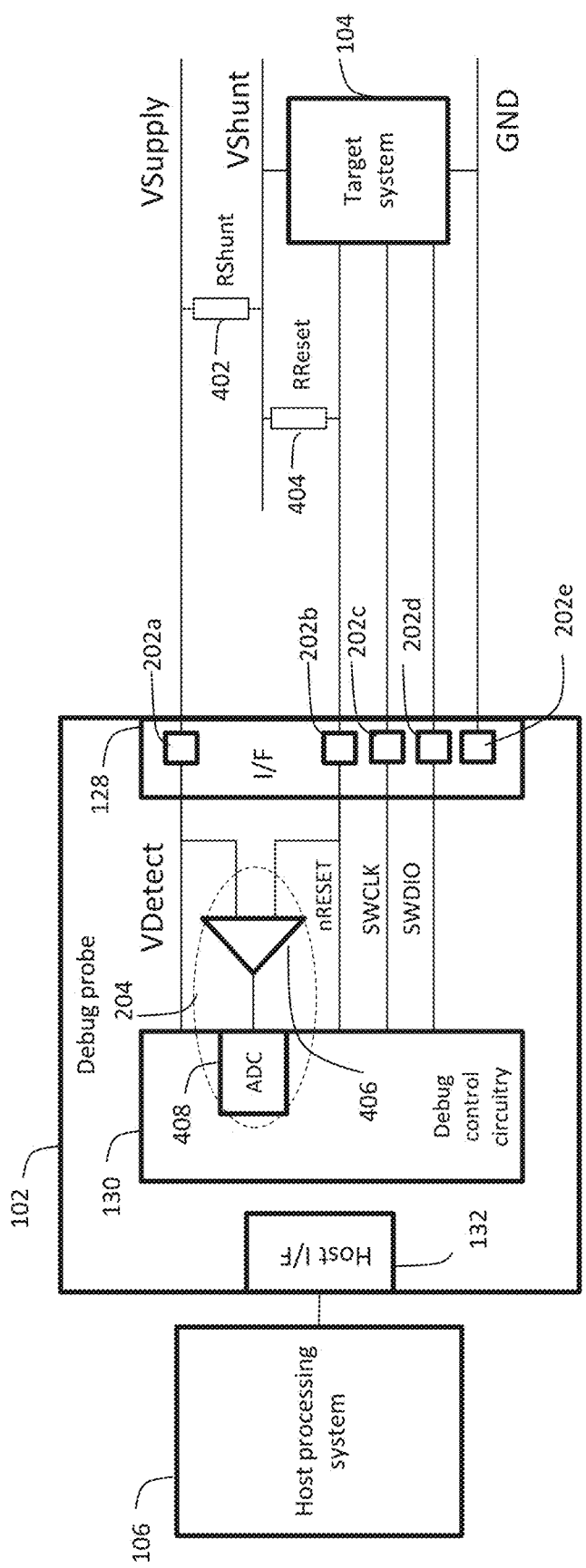
FIG. 4 schematically illustrates an example of how the debug probe of FIG. 2 can be used to measure a property of the target system.

An example of how the debug probe 102 of the present technique can be arranged to make a measurement of a property of the target system 104 is illustrated in FIG. 4. In this particular example, pins 202a, 202b, 202c and 202d of the debug interface 128 correspond with pins 1, 10, 4 and 2 respectively of the debug connector shown in FIG. 3, and pin 202e may correspond with either pin 3 or pin 5.

In FIG. 4, a VDetect pin 202a connects to the supply voltage, VSupply, of the target system 104. The debug control circuitry 130 may use a digitally sampled value of the signal received through this pin to determine whether the target system 104 is currently connected to the debug probe—for example, when the debug control circuitry 130 detects that a signal is asserted through VDetect pin 202a (e.g. when the digitally sampled level of the signal on pin 202a is logic 1), it determines that the target system 104 is connected. More particularly, the debug control circuitry 130 may determine that the target system 104 is connected when the voltage detected at the VDetect pin 202a is above a certain threshold level (e.g. when the debug control circuitry determines that the digitally sampled level of the signal is logic "1").

The debug control circuitry may also be arranged to assert a reset signal via the reset (nRESET) pin 202b, which triggers a reset of the target system 104. An example of how the reset signal may be implemented will be discussed below, but in some examples the reset signal may be asserted when the digitally sampled level of the signal at the target system is logic "0". The reset signal may be asserted when the debugger needs to reset the target system to a known state. Processing systems typically include a reset tree of circuit hardware logic which, in response to the assertion of the reset signal, causes storage circuit elements of the processing system to be reset to a default state (some circuit elements may be reset at logic 1 and other circuit elements may be reset at logic 0). Hence, by providing functionality for the debug probe (e.g. under control of the debug software 138 on the host processing system) to reset the target system to a consistent default state, this can allow debug tests to be performed reliably by ensuring the system is in a consistent state before starting the test. In practice, this means that the reset signal will tend to be asserted at the very start of debugging, but after that is expected to remain constant in the non-asserted state throughout the remainder of the debug test being performed.

Power is supplied to the target system 104 from the supply line VSupply via a shunt resistor, RShunt, 402. The shunt resistor 402 therefore reduces the voltage across the target system 104 to a lower voltage, VShunt.

A reset resistor, RReset, 404 is also provided. The reset resistor 404 is connected between the shunt resistor 402 and the reset pin 202b, in parallel with the target system 104 (and in series with the shunt resistor 402).

The resistance of the reset resistor 404 can be chosen to be several orders of magnitude greater than the resistance of the shunt resistor 402, and greater than the effective resistance of the target system 104. This means that the current flow through the reset resistor 404 is negligible, so that when the reset signal is being asserted, the current through the reset resistor 404 is small enough to avoid the reset signal pulling the voltage supply to the target system (VShunt) to ground, which may prevent the target system 104 from resetting correctly.

In addition, since the current flow through the reset resistor 404 is negligible, all the current passing through the shunt resistor 402 can be considered to be drawn by the target system 104 (even including the current drawn by paths of the target system 104 not coupled to the reset pin 202).

Also, by choosing a shunt resistor 402 with a relatively low resistance in comparison to the effective resistance of the target system 104 and the reset resistor 404, this means that the voltage drop between Vsupply and VShunt may be low and therefore the voltage difference between VSupply and the reset line can be considered approximately equivalent to the voltage difference between VShunt and the reset line (i.e. virtually all the voltage drop between VSupply and the reset line can be attributed to the target system 104 rather than the shunt resistor 402).

Therefore, by measuring the voltage difference between the VDetect pin 202a and the reset pin 202b at the debug probe 102, this can be used as an approximate measure of the voltage across the target system, which scales with the current drawn through the shunt resistor 402, which can be assumed to be same as the current through the target system 104 due to the high resistance of the reset resistor 404. Hence, the voltage difference between pins 202a, 202b is a measure of instantaneous current drawn by the target system, or instantaneous power consumption of the target system.

It will be appreciated that, although the current measured using this technique is not exactly equal to the current through the target system 104—several approximations have been made in implementing this technique—the inventor realised that for most debug tests an approximate indication of instantaneous power consumption of the target system 104 when executing a particular section of code is enough, and thus the measurement does not need to be precise.

The small resistance of the shunt resistor 402 also means that this technique does not significantly impact on the level of the supply voltage seen by the target system 104—VShunt is not significantly lower than the supply voltage (Vsupply), and so this reduction in voltage should not impact on the correct functioning of the processor of the target system 104.

The exact resistances of the shunt resistor 402 and the reset resistor 404 may vary depending on the particular implementation of the present technique, but in some examples the resistance of the shunt resistor 402 may be approximately 0.1Ω and the resistance of the reset resistor 404 may be approximately 10 kΩ.

The voltage difference between the VDetect pin 202a and the reset pin 202b is measured by measuring circuitry 204. In this particular example, the measuring circuitry 204 comprises a differential amplifier 406, which generates an amplified analogue signal indicative of the voltage difference between the VDetect pin 202a and the reset pin 202b. This amplified signal can then be provided to an analogue-to-digital converter (ADC) 408, which converts the amplified analogue signal into a digital measurement of a property of the target system. This digital signal may be provided to the host processing system 106 via the host interface 132.

Using this technique, a measurement of a property of the target system 104 can be made using a debug probe with minimal structural alterations. In particular, the structure of the debug interface 128 does not need to be altered, since the same pins are being used for debugging and for measuring the property of the target system. Similarly, since the measurement of the target property is made through the debug interface 128 of the debug probe 102 and the debug interface of the target system 104, only minimal structural alterations are required in the target system 104.

Therefore, this is a particularly cost-effective approach to making a measurement of a property of the target system, since only minimal adaptations to the debug probe and target system are required.

It will be appreciated that the target system 104 itself is not part of the debug probe 102, and the specific circuit connections between the debug probe 102 and the target system 104 may be chosen by the user (e.g. a developer) who is using their debug probe 102 to test software running on a specific target system 104. The debug probe 102 can therefore be marketed as a standalone product, separate from any target system 104 itself. The target system 104 is what is tested by the debug probe 102 for a specific test scenario. Thus, the debug probe 102 is a product that the same user can use repeatedly with different target systems 104, so the shunt resistor 402 and the reset resistor 404 are not part of the debug probe 102, but instead would be built onto a development board by the user when they are connecting the debug probe 102 to the target system 104.

While FIG. 4 shows the VDetect pin 202a and the reset pin 202b being used to measure a voltage difference associated with the target system, it will be appreciated that other combinations of pins may also be used, provided that the signal transmitted through each of the pins chosen to make the measurement is expected to remain at a constant digital level during normal operation of the target system.

Figure 5:
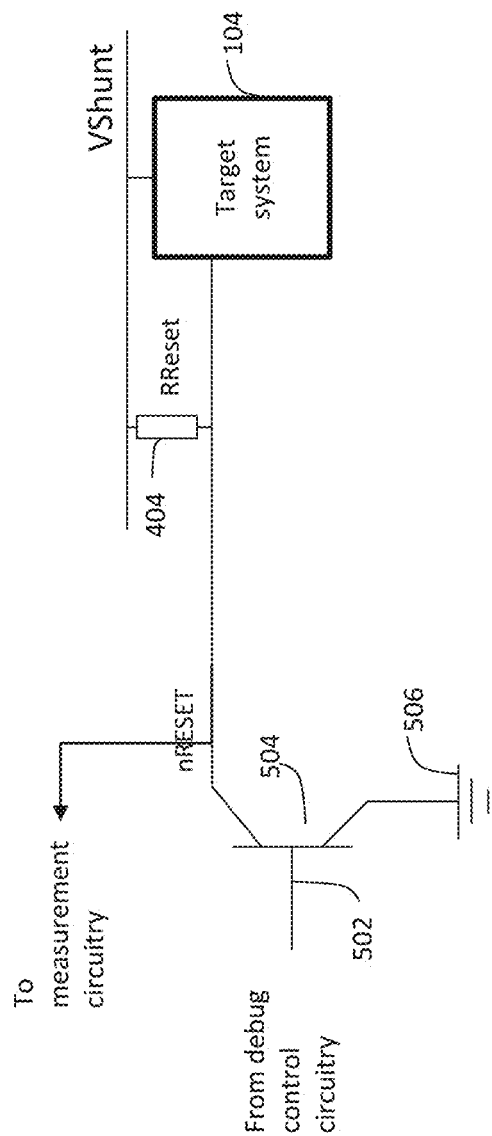
FIG. 5 is a circuit diagram illustrating an example of how the reset signal of the debug probe in FIG. 4 can be implemented.

The reset signal asserted by the debug control circuitry may be implemented as an open drain output of the debug control circuitry, as shown in the circuit diagram of FIG. 5. In the implementation shown in FIG. 5, an output from the debug control circuitry is applied to the gate 502 of a transistor 504. The reset signal is asserted by the debug control circuitry applying the gate signal 502 to the transistor, which pulls the voltage in the target system 104 down to ground.

Conversely, when the reset signal is not being asserted by the debug control circuitry, this means that the gate signal 502 is not applied to the transistor and thus no current can flow through the transistor 504. The debug control circuitry therefore leaves the output line to float and no active signal is asserted onto the output line by the debug control circuitry. Normally, the target system 104 would not assert any signal onto the reset signal, but in the example shown in FIGS. 4 and 5, the reset line can be coupled to the supply voltage (VSupply) via the reset resistor 404 and the shunt resistor, so that a non-floating potential is applied to the reset line which has a value depending on instantaneous current through the target system. This allows the signal communicated through the reset pin to be used to make a measurement of the property of the target system 104 when the reset signal is not being asserted by the debug control circuitry.

The approach described with reference to FIG. 4 involves measuring a voltage difference across two pins of the debug connector. An alternative approach to measuring a property of the target system using a debug probe takes advantage of a property demonstrated in FIG. 6.

Figure 6:
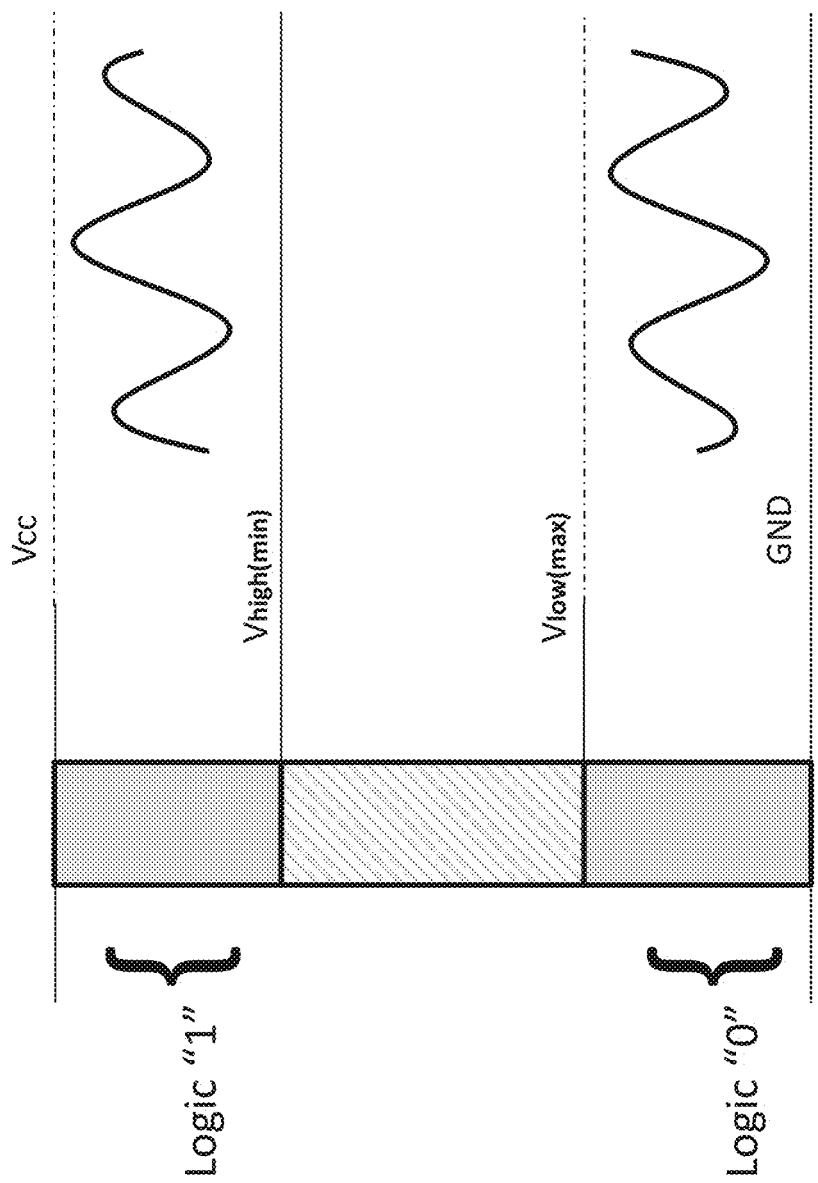
FIG. 6 schematically illustrates measurement of an analogue quantity based on modulation of a digitally sampled signal within the band allocated for representing a constant digital level.

As noted above, the signals communicated between the debug control circuitry and the target system in the course of debugging are interpreted (either by the debug control circuitry 130 or by the target system 104) as digital signals. This means that each bit of a signal is interpreted as a logic "1" value or a logic "0" value. FIG. 6 illustrates how this may work in practice. The debug control circuitry and the target system may be arranged to detect a logic "1" value when a voltage above a given threshold (Vhigh(min)) is detected, and to detect a logic "0" value when a voltage below a given threshold (Vlow(max)) is detected. It will be appreciated that, while FIG. 6 shows two separate thresholds, in other examples there may only be one threshold, above which a logic "1" value is detected and below which a logic "0" value is detected.

As a result of this arrangement, any voltage within a predetermined range of voltages (e.g. between Vhigh(min) and Vcc) will be interpreted as logic "1", and any voltage within a second predetermined range of voltages (e.g. between Vlow(max) and GND) will be interpreted as a logic "0". This means that the voltage can be modulated within one or both of these voltage bands without affecting the digital signal detected. This can allow information indicative of a property of the target system to be transmitted to the debug probe as a modulation of the voltage detected through one of the pins of the debug interface, provided that the modulation remains wholly within the logic "1" range, or wholly within the logic "0" range. For example, since the digitally sampled level of the signal communicated through the VDetect pin is expected to remain at a constant level of logic "1" when the target system is connected to the debug probe, the voltage detected through the VDetect pin can be modulated within the logic "1" band (e.g. between Vhigh (min) and Vcc) to provide information about a property of the target system. The measurement circuitry in the debug probe may then detect this modulation, and determine a measurement of the property of the target system based on the modulation. Similarly, the signal on one of the other pins of the debug interface may be modulated to provide an indication of the property of the target system, provided that the digitally sampled level of the signal communicated through that pin is expected to remain at a constant level while the measurement is being taken.

It will be appreciated that although the above examples (FIG. 4 and FIG. 6) each only describe measuring a single property of the target system, it is also possible for each of these techniques to be applied to measure multiple properties of the target system. Moreover, these approaches could be applied in combination to measure multiple properties of the target system.

Figure 7:
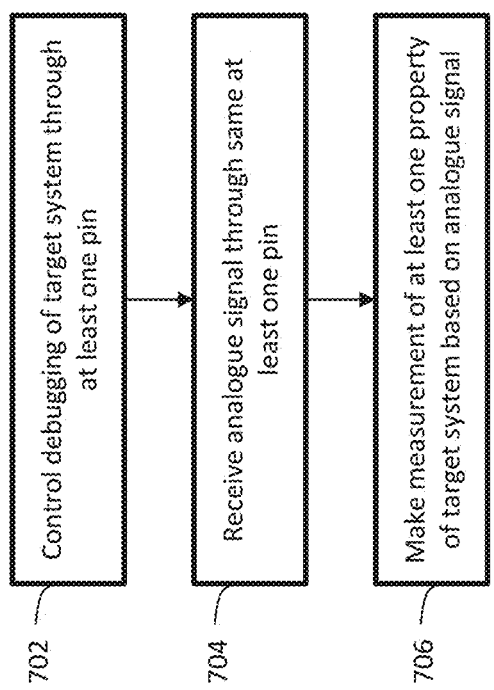
FIG. 7 is a flow diagram illustrating a method of measuring a property of a target system using a debug probe.

FIG. 7 is a flow diagram illustrating a method carried out by a debug probe in accordance with the present technique. In particular, the method includes a step 702 of controlling debugging of the target system based on signals communicated through at least one of a plurality of pins in the debug interface of the debug probe. The debug probe is also configured to perform a step 704 of receiving an analogue signal through the same at least one pin. Based on this analogue signal, the debug probe is then arranged to perform a step 706 of making a measurement of at least one property of the target system.

Figure 8:
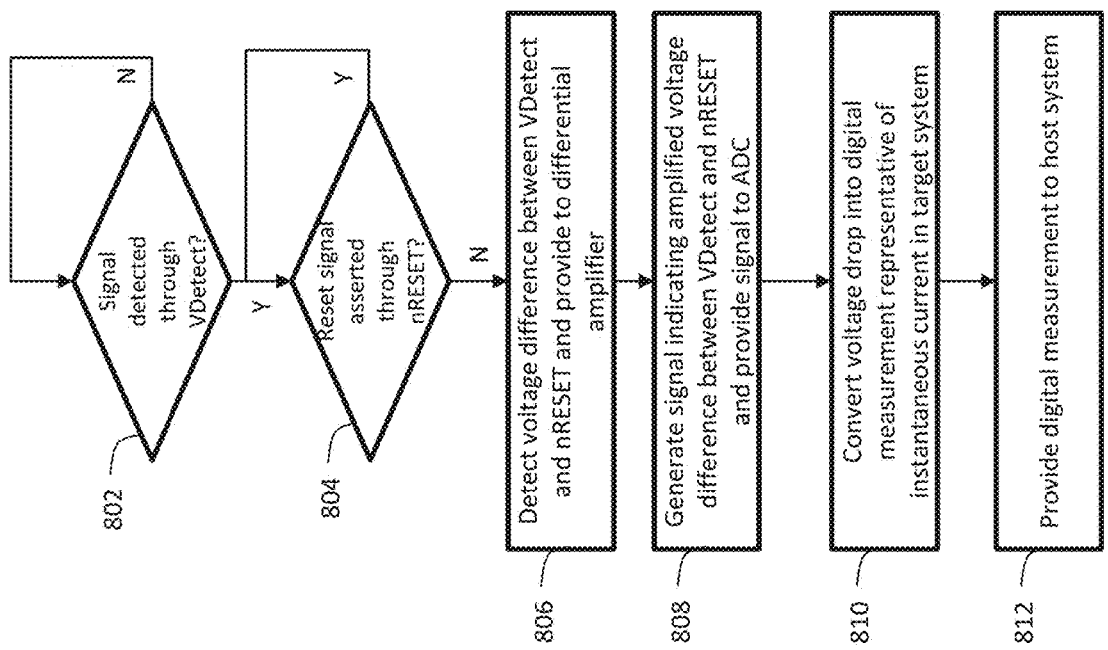
FIG. 8 is a flow diagram illustrating a more detailed example of how the method of FIG. 7 may be implemented.

FIG. 8 is a flow diagram illustrating a method of measuring at least one property of the target system in more detail. In particular, FIG. 8 illustrates a method carried out by the debug probe in line with the example shown in FIG. 4.

The method of FIG. 8 includes a step 802 of waiting until a signal has been detected through the VDetect pin (or, in some examples, waiting until the signal communicated through the VDetect pin is detected as being asserted (e.g. at a digitally sampled level of logic 1)), and a step 804 of determining whether the reset signal is currently being asserted through the reset pin. These steps can be carried out in any order. When a signal is detected through the VDetect pin and no reset signal is currently being asserted, the debug probe performs a step 806 of detecting the voltage difference between the VDetect pin 202a and the reset pin 202b, and providing this to a differential amplifier. The method also includes a step 808 of the differential amplifier generating a signal indicating an amplified voltage difference between the VDetect and reset pins, and providing this amplified voltage difference to the analogue-to-digital converter (ADC).

In a step 810, the method involves the ADC converting the amplified voltage difference (which is an analogue signal) into a digital measurement representative of the instantaneous current in the target system. Finally, in a step 812, this digital measurement is provided to the host interface.

In this way, a measurement of at least one property of the target system can be made using a debug probe, based on an analogue level of a signal communicated through a standard debug interface. This significantly reduces the costs associated with measuring one or more properties of the target system.

In the present application, the words "configured to . . ." are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

The invention claimed is:

1. A debug probe for controlling debugging of a target system, the debug probe comprising:
an interface comprising a plurality of pins;
debug control circuitry to control debugging of the target system based on a digitally sampled level of at least one signal communicated through at least one of the plurality of pins; and
measurement circuitry to make a measurement of a property of the target system based on an analogue level of a signal received through at least one same pin of the plurality of pins as said at least one of the plurality of pins.

2. The debug probe of claim 1, wherein:
the property of the target system comprises at least one of:
an electrical current in the target system;
instantaneous power consumption in the target system; and
a voltage difference across the target system.

3. The debug probe of claim 1, wherein:
the at least one signal comprises at least one signal expected to be at a constant digital level during functional operation of the target system.

4. The debug probe of claim 1, wherein:
the at least one of the plurality of pins comprises at least a first pin and a second pin, wherein the measurement circuitry is configured to receive a first signal through the first pin and a second signal through the second pin; and
the measurement circuitry is configured to detect a voltage difference between the first pin and the second pin.

5. The debug probe of claim 4, wherein:
the measurement circuitry comprises a differential amplifier to receive the first signal and the second signal and to generate an amplified analogue signal indicative of the voltage difference between the first pin and the second pin.

6. The debug probe of claim 1, wherein:
the debug control circuitry is configured to assert a reset signal via a reset pin of the at least one of the plurality of pins, to trigger a reset of the target system; and
the measurement circuitry is configured to make the measurement of the property of the target system based on the analogue level of the signal received on the reset pin in absence of the reset signal being asserted by the debug control circuitry.

7. The debug probe of claim 6, wherein:
the reset pin is coupled to an open drain output of the debug control circuitry.

8. The debug probe of claim 1, wherein:
the measurement circuitry is configured to detect the analogue level of the signal based on a modulation of the at least one signal communicated through the at least one of the plurality of pins.

9. The debug probe of claim 8, wherein:
the debug control circuitry is configured to detect whether the at least one signal is asserted based on a comparison between a voltage detected through the at least one of the plurality of pins and a threshold voltage;
the measurement circuitry is configured to detect the analogue level of the signal based on a modulation of the voltage detected through the at least one of the plurality of pins in a range of voltages entirely below the threshold voltage or a range of voltages entirely above the threshold voltage.

10. The debug probe of claim 1, wherein:
the measurement circuitry comprises an analogue-to-digital converter to convert an analogue measurement dependent on the analogue level of the signal received through said at least one of the plurality of pins into a digital measurement of the property of the target system.

11. The debug probe of claim 1, wherein:
the debug control circuitry is configured to detect the presence of the target system based on the digitally sampled level of the at least one signal communicated through the at least one of the plurality of pins.

12. The debug probe of claim 1, comprising:
a host interface;
wherein the debug control circuitry is configured to communicate with a host processing system through the host interface.

13. The debug probe of claim 12, wherein:
the measurement circuitry is configured to provide the measurement of the property of the target system to the host processing system via the host interface.

14. The debug probe of claim 1, wherein:
controlling debugging of the target system comprises at least one of:
the debug control circuitry requesting information from the target system indicative of the state of one or more registers in the target system;
the debug control circuitry injecting one or more instructions into processing circuitry of the target system and observing an effect of at least one process performed by the processing circuitry following the injection of the one or more instructions; and the debug control circuitry collecting trace data output by trace generation circuitry in the target system, wherein the trace data comprises data indicative of processing activities of the processing circuitry.

15. A system comprising:
the debug probe of claim 1; and
the target system.

16. The system of claim 15, comprising:
a shunt resistor coupled between a supply voltage source and the target system;
wherein the target system is configured to draw current through the shunt resistor.

17. The system of claim 16, wherein:
the at least one of the plurality of pins comprises at least a first pin and a second pin, wherein the measurement circuitry is configured to receive a first signal through the first pin and a second signal through the second pin;
the measurement circuitry is configured to detect a voltage difference between the first pin and the second pin; and
the first pin and the second pin are connected either side of the shunt resistor.

18. The system of claim 17, wherein:
the debug control circuitry is configured to assert a reset signal via the second pin to trigger a reset of the target system;
the measurement circuitry is configured to detect the voltage difference between the first pin and the second pin in absence of the reset signal being asserted by the debug control circuitry; and
the system comprises a reset resistor connected between the shunt resistor and the second pin, in parallel with the target system, where the reset resistor has a higher resistance than the shunt resistor.

19. The debug probe of claim 1, wherein the at least one same pin is configured to be used simultaneously for both measurement of the property based on the analogue level of the signal received through the at least one same pin and to control debugging of the target system based on the digitally sampled level of the at least one signal communicated through the at least one same pin.

20. A method of measuring at least one property of a target system using a debug probe comprising an interface comprising a plurality of pins, the method comprising:
controlling debugging of the target system based on a digitally sampled level of at least one signal communicated through at least one of the plurality of pins; and
making a measurement of a property of the target system based on an analogue level of a signal received through at least one same pin of the plurality of pins as said at least one of the plurality of pins.

* * * * *